United States Patent [19]

Naik et al.

[11] Patent Number: 4,521,443
[45] Date of Patent: Jun. 4, 1985

[54] INTEGRATED OPTICAL WAVEGUIDE FABRICATION BY ION IMPLANTATION

[75] Inventors: Ishverlal K. Naik, Rancho Palos Verdes; Ronald G. Eguchi, Lakewood, both of Calif.

[73] Assignee: Northrop Corporation, Hawthorne, Calif.

[21] Appl. No.: 607,499

[22] Filed: May 7, 1984

[51] Int. Cl.³ ............................................... B05D 3/06
[52] U.S. Cl. ........................................ 427/38; 427/163
[58] Field of Search ................... 427/35, 38, 163, 162; 204/192 N

[56] References Cited

U.S. PATENT DOCUMENTS

| | | | |
|---|---|---|---|
| 3,562,022 | 2/1971 | Shierin | 427/35 |
| 4,145,457 | 5/1979 | Kersten | |
| 4,262,056 | 4/1981 | Hubler et al. | |
| 4,375,312 | 3/1983 | Tangonan | 427/163 |
| 4,411,678 | 10/1983 | Arai | 427/163 |
| 4,465,337 | 8/1984 | Baron et al. | 427/38 |

OTHER PUBLICATIONS

Standley et al., "Properties of Ion-Bombarded Fused Quartz for Integrated Optice", Applied Optics, vol. II, pp. 1313-1316, (Jun. 1972).

Webb et al., "Refractive Index Profiles Induced by Ion Implantation Into Silica", J. Phys. D.: Applied Physics, vol. 9, pp. 1343-1354, (1976).

Primary Examiner—John H. Newsome
Attorney, Agent, or Firm—Terry J. Anderson

[57] ABSTRACT

A method for fabricating optical waveguides and other optical devices. Nitrogen ions are implanted by ion bombardment in a substrate composed of silicon dioxide. Damage to the atomic structure caused by the bombardment is removed by annealing to obtain a low-loss device. The chemical interaction of the nitrogen ions with the silicon dioxide creates an implanted region having an increased index of refraction, which implanted region retains the increased refractive index after annealing.

6 Claims, 2 Drawing Figures

INTEGRATED OPTICAL WAVEGUIDE FABRICATION BY ION IMPLANTATION

BACKGROUND OF THE INVENTION

1. Field of the Invention

The present invention relates to a process using nitrogen ion implantation to increase the index of refraction near the surface of an amorphous silicon dioxide or glass substrate. The process is particularly suited for fabricating integrated optical waveguides and other integrated optical devices.

2. Description of the Prior Art

The field of integrated optics deals with the miniaturization and integration of optical and electro-optical devices using technologies derived from the field of microelectronics. As compared with larger discrete optics, integrated optics allow devices to be constructed more cheaply and much more compactly, and it facilitates interfacing between optical and electronic components.

Integrated optical devices are fabricated by modifying the optical propagation characteristics of selected regions of an optically transmissive substrate. The basic building block of an integrated optical device is an optical waveguide whose function in integrated optics is somewhat analagous to that of a conductor in microelectronics. A waveguide is fabricated in a substrate by forming a channel having a higher index of refraction than the surrounding regions. Light propagating along the channel will be guided and confined within the channel because of total internal reflection at the channel boundaries.

Amorphous silicon dioxide, in the form of silica or fused quartz, is widely used as a substrate for fabricating integrated optical waveguides because it is highly transparent at visible and infrared wavelengths; i.e., it offers low attenuation to visible and infrared light. The following references illustrate the chronological development of the art of optical waveguide fabrication in silicon dioxide substrates.

In 1972, Standley, Gibson, and Rodgers reported in "Properties of Ion-Bombarded Fused Quartz for Integrated Optics," Applied Optics, vol. 11, pages 1313-1316, June 1972, that the index of refraction of fused quartz could be increased by ion bombardment. They suggested fabricating low-loss optical waveguides using ion bombardment to increase the index of refraction of a channel in a quartz substrate. Standley et al. investigated the changes in the index of refraction of fused quartz due to implantation by bombardment with ions of He, Li, C, P, Xe, Tl, and Bi. They deduced that the desired changes in the refractive index, and the concomitant increase in the undesired propagation losses in the quartz, were primarily due to structural disorder produced by the bombardment rather than by chemical doping effects produced by the implanted particles. Thus, Standley, et al. did not disclose a means for increasing the refractive index of a substrate without a substantial increase in propagation losses.

Standley et al. concluded that most of the increase in refractive index achieved by the bombardment could be removed by annealing, which annealing also significantly reduced the propagation losses. Although their data indicates that a small residual change in the index of refraction due to bombardment by lithium ions remained after annealing, they apparently attached little significance to this residual effect and attributed it to "partial" annealing.

Standley et al. did not investigate the implantation of nitrogen ions. Also, they did not suggest that the changes caused by ion bombardment included significant chemical changes that might remain after annealing.

In 1976, in "Refractive Index Profiles Induced by Ion Implantation into Silica," J. Phys. D: Applied Physics, Vol. 9, 1976, pp. 1343-1354, printed in Great Britain, Webb and Townsend reported increases in the refractive index of silica (silicon dioxide) due to ion implantation by a number of different ions, namely H+, He+, Li+, B+, Na+, Ar+, Bi+, N+. They reported an increase in the refractive index of up to six percent for nitrogen and a one to two percent change in the index of the refraction for the other ions. Webb and Townsend suggested that the greater change in the index of refraction for nitrogen implantation might be due to a chemical process rather than to the compaction process which was thought to have caused the increases in the index when the other ions were used. Although Webb and Townsend attributed the greater increase in refractive index achieved with nitrogen ion bombardment as being due to a chemical change, they made no suggestion that the propagation losses in the substrate could be reduced by annealing, nor did they suggest that a major portion of the change in the index of refraction due to nitrogen ion implantation would remain after annealing.

Kersten, in U.S. Pat. No. 4,145,457, issued in 1979, disclosed a method for fabricating optical waveguides and directional couplers in quartz by implanting any one of a number of different ions, of which nitrogen was an example. Like Webb and Townsend, however, Kersten did not suggest the use of an annealing process to reduce the propagation loss in the waveguides, nor did he disclose that the nitrogen ions would produce a higher residual change in the index of refraction after annealing than the other ions considered.

Hubler et al disclosed in U.S. Pat. No. 4,262,056, issued in 1981, the use of nitrogen ions for bombarding a substrate to change the index of refraction for the purpose of fabricating a multilayer optical interference filter. However, the substrate material disclosed by Hubler, however, was silicon (Si) rather than silicon dioxide ($SiO_2$). As will be illustrated below, the chemical properties of silicon and silicon dioxide are quite different, so that processes in one environment cannot be expected to apply to the other.

In Hubler et al., the implantation was performed at a high temperature of 600° C. to 1000° C. in order to cause the implanted ions to form silicon nitride ($Si_3N_4$), and the substrate was maintained at this high temperature for a period of three to five hours during the implantation. Hubler et al. indicated that the high temperature removed the radiation damage to the crystallinity of the single-crystal layer of silicon overlying the implanted layer of silicon nitride, so that the optical properties of the overlying layer were unchanged from those of pure crystal and silicon. However, Hubler et al. did not discuss propagation losses in the implanted region or whether the high temperature affected such losses.

Also, Hubler et al. discloses that the nitrogen ion implantation of silicon substrates decreases the index of refraction in the implanted region, rather than increasing it as in the case of silicon dioxide substrates. This makes Hubler's process ill-suited to the fabrication of optical waveguides which require a channel having a higher refractive index than the surrounding substrate.

If Hubler's disclosed heating temperatures and times were applied to a silicon dioxide substrate rather than Hubler's disclosed silicon substrate, the heat would cause most of the implanted nitrogen ions to diffuse away from the implanted region, thus destroying the intended increase of the refractive index in that region.

SUMMARY OF THE INVENTION

In the present invention an optical waveguide or other optical device is fabricated by bombarding a substrate of silicon dioxide (silica or quartz) with nitrogen ions. The substrate is also annealed, preferably at 450 to 500 degrees Celsius for approximately thirty minutes, to remove most of the optical propagation loss introduced into the substrate by the compaction of or damage to the atomic structure caused by the bombardment. The annealing in this invention does not significantly reduce the increase in the index of refraction achieved by the chemical interaction of the nitrogen ions with the silicon dioxide. The process can thus produce a low-loss optical waveguide.

DETAILED DESCRIPTION

Figure 1:
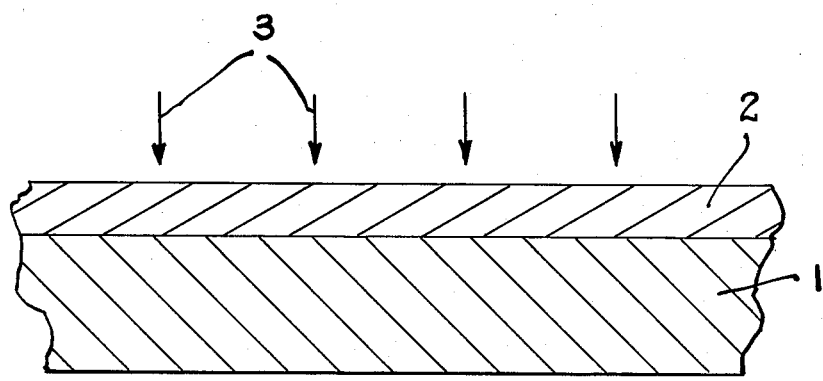
FIG. 1 depicts a planar waveguide.

Referring to FIG. 1, a substrate 1 is composed of silicon dioxide, preferably polished optical grade fused silica or fused quartz. Alternatively, a silicon dioxide layer over a silicon substrate could be substituted for the silicon dioxide substrate 1. The substrate 1 is bombarded by nitrogen ions moving in the direction indicated by arrows 3. The nitrogen ions are implanted in region 2 near or adjacent to the surface of substrate 1.

As a consequence of the bombardment, the index of refraction of region 2 is raised above that of substrate 1. The increase is caused both by compaction resulting from damage to the atomic structure of the substrate and by a chemical combination of the implanted nitrogen ions with the silicon dioxide. In the chemical interactions it is thought that some of the oxygen ions are replaced by the nitrogen ions so as to form nitrogen-doped silicon oxide ($SiO_xN_y$).

The ion bombardment energy is preferably 100 to 1000 KeV, and the dosage is preferably $1 \times 10^{16}$ to $3 \times 10^{17}$ ions per square centimeter. Lesser or greater energy levels may be used to obtain implantation nearer the surface or deeper into the substrate, and higher or lower bombardment dosages may be used to obtain greater or lesser changes in refractive index.

Either during or after the bombardment, substrate 1 is annealed, preferably at 450 to 500 degrees Celsius, for a time period (preferably 30 minutes) sufficient to remove the damage to the atomic structure caused by the bombardment, thereby reducing the optical propagation losses in region 2. A higher temperature may be used for a shorter period of time, or a lower temperature for a longer period of time, to achieve the annealing. The annealing temperature and times, however, should not be so excessive as to disturb the chemical interaction of the nitrogen ions with the silicon dioxide and thus destroy the increase in the refractive index achieved thereby.

Thus one obtains a substrate 1 with a region 2 near the surface having an increased index of refraction. Both the substrate and the surface layer exhibit low loss to optical waves. As is well known in the art, a low-loss substrate having a low-loss surface layer of increased index of refraction is desirable for use as an optical waveguide.

In contrast to the process disclosed here, if high temperatures of 600 to 1000 degrees C. and extended annealing periods of 3 to 5 hours, as disclosed in U.S. Pat. No. 4,262,056, were used in the annealing process during or after implantation of the nitrogen ions in the silica, these excessive temperatures and periods of time would cause a significant portion of the implanted nitrogen ions to diffuse away from the implanted region 2 and thus destroy the increase in the refractive index obtained by implantation.

A significant reduction in the optical waveguide loss is obtained by the annealing process. For example, in actual tests a planar waveguide exhibited a loss of 5 to 6 db per centimeter before annealing, while after annealing the loss was reduced to 0.1 db per centimeter.

In a process contrary to the present invention wherein the change in the refractive index of region 2 is due primarily to compaction resulting from damage to the atomic structure, this increase in refractive index would be removed by the annealing process, and consequently the annealed device would not perform satisfactorily as a waveguide. However, because in the present invention the implanted nitrogen ions interact chemically with the silicon dioxide to raise the index of refraction, the annealing process reduces the refractive index of the implanted region 2 only slightly. After annealing, the refractive index of region 2 therefore remains substantially higher than that of the surrounding substrate 1, allowing region 2 to function as an optical waveguide.

Figure 2:
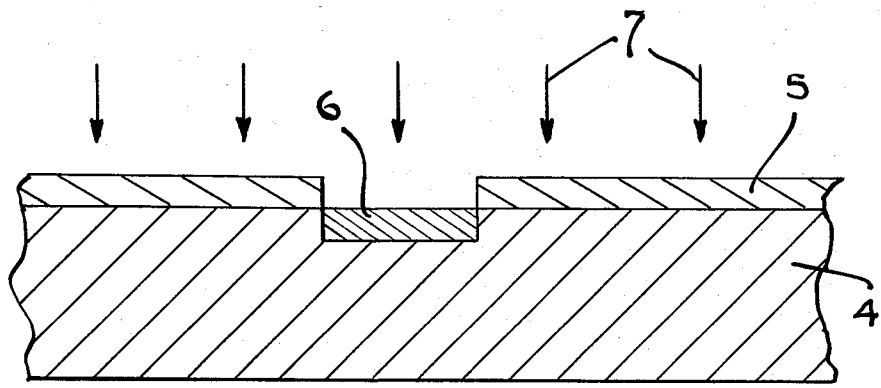
FIG. 2 depicts a two-dimensional waveguide, formed by the process of the present invention.

FIG. 2 depicts a 2-dimensional channel waveguide. To produce the channel waveguide, the silicon dioxide of substrate 4 is bombarded by nitrogen ions moving in the direction of arrows 7 to implant the ions in channel 6 thus raising the index of refraction of the channel. Prior to ion bombardment a gold film 5 approximately 2000 angstroms thick is deposited on substrate 4 using an aluminum binder film approximately 200 angstroms thick. The portion of gold film 5 covering channel 6 is removed by standard photolithographic and etching processes in order to expose channel 6 to the ion bombardment. Following implantation the gold mask is stripped in a cyanide etch, then the substrate is annealed in flowing nitrogen. A low-loss optical channel waveguide is produced by this process.

We claim:

1. A method for fabricating an optical device in a silicon dioxide substrate, comprising:
   bombarding a selected area of the substrate with nitrogen ions to implant the ions in a region of the substrate below the selected area so as to raise the index of refraction of the region; and
   heating the substrate to anneal the substrate so as to repair a substantial portion of any damage to the atomic structure of the substrate caused by the ion bombardment.

2. The method of claim 1 wherein the substrate is composed of amorphous silicon dioxide.

3. The method of claim 1 wherein the heating step is performed subsequent to the bombarding step.

4. The method of claim 1 wherein the heating step and the bombarding step are performed simultaneously.

5. The method of claim 1 wherein the heating step consists essentially of heating the substrate to a temperature in the range of 300 to 600 degrees Celsius for a time period in the range of 15 minutes to 3 hours.

6. The method of claim 1 wherein the bombarding step comprises bombarding the selected area with nitrogen ions having an energy in the range of 100 to 1000 KeV and a dosage in the range of one to thirty million ions per square centimeter.

* * * * *

UNITED STATES PATENT OFFICE
CERTIFICATE OF CORRECTION

PATENT NO. : 4,521,443
DATED : Jun. 4, 1985
INVENTOR(S) : Ishverial K. Naik and Ronald G. Eguchi It is certified that error appears in the above—identified patent and that said Letters Patent are hereby corrected as shown below:

In claim 6, column 6, line 3, delete "million" and substitute therefor --$10^{16}$--.

Signed and Sealed this

Nineteenth Day of November 1985

[SEAL]

Attest:

DONALD J. QUIGG

Attesting Officer     Commissioner of Patents and Trademarks